United States Patent
Yoo et al.

(10) Patent No.: US 8,625,014 B2
(45) Date of Patent: Jan. 7, 2014

(54) AMPLIFIER FOR REDUCING HORIZONTAL BAND NOISE AND DEVICES HAVING THE SAME

(75) Inventors: Kwi Sung Yoo, Seoul (KR); Seog Heon Ham, Suwon-si (KR); Dong Hun Lee, Yongin-si (KR); Min Ho Kwon, Seoul (KR); Wun-Ki Jung, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 307 days.

(21) Appl. No.: 13/074,494

(22) Filed: Mar. 29, 2011

(65) Prior Publication Data

US 2011/0279718 A1    Nov. 17, 2011

(30) Foreign Application Priority Data

May 11, 2010    (KR) .................. 10-2010-0043929

(51) Int. Cl.
*H04N 5/335*    (2011.01)
*H03F 3/45*    (2006.01)

(52) U.S. Cl.
USPC .................... 348/300; 330/257; 348/301

(58) Field of Classification Search
USPC ................................... 348/294–308
See application file for complete search history.

(56) References Cited

U.S. PATENT DOCUMENTS

| | | | |
|---|---|---|---|
| 8,259,196 B2 * | 9/2012 | Yoshikawa et al. | 348/241 |
| 2008/0180559 A1 * | 7/2008 | Yan | 348/307 |
| 2008/0239127 A1 * | 10/2008 | Koseki et al. | 348/308 |
| 2008/0272845 A1 | 11/2008 | Willassen et al. | |
| 2008/0273106 A1 * | 11/2008 | Amini et al. | 348/301 |
| 2009/0128653 A1 * | 5/2009 | Tanaka | 348/222.1 |
| 2009/0128676 A1 * | 5/2009 | Tanaka | 348/300 |
| 2009/0167914 A1 * | 7/2009 | Itano et al. | 348/301 |
| 2011/0199366 A1 * | 8/2011 | Tsuchi | 345/212 |
| 2011/0254986 A1 * | 10/2011 | Nishimura et al. | 348/302 |
| 2012/0019697 A1 * | 1/2012 | Suzuki et al. | 348/308 |
| 2012/0081586 A1 * | 4/2012 | Itano et al. | 348/301 |

FOREIGN PATENT DOCUMENTS

| | | |
|---|---|---|
| JP | 2006-254170 | 9/2006 |
| JP | 2007-336025 | 12/2007 |
| KR | 1020060099976 A | 9/2006 |

\* cited by examiner

*Primary Examiner* — Tuan Ho
*Assistant Examiner* — Selam Gebriel
(74) *Attorney, Agent, or Firm* — F. Chau & Associates, LLC

(57) ABSTRACT

An amplifier is provided. The amplifier includes a differential amplifier including a tail, a current mirror connected between output terminals of the differential amplifier and a power line receiving a supply voltage, and a first switching circuit for connecting and disconnecting one of the output terminals of the differential amplifier to and from the tail in response to a first switching signal.

20 Claims, 8 Drawing Sheets

AMPLIFIER FOR REDUCING HORIZONTAL BAND NOISE AND DEVICES HAVING THE SAME

CROSS-REFERENCE TO RELATED APPLICATIONS

This application claims priority under 35 U.S.C. §119 to Korean Patent Application No. 10-2010-0043929 filed on May 11, 2010, the disclosure of which is incorporated by reference in its entirety herein.

BACKGROUND

1. Technical Field

Embodiments of the present inventive concept relate to an amplifier and devices having the same.

2. Discussion of Related Art

The quality of images processed by complementary-metal-oxide-semiconductor (CMOS) image sensors may degrade due to noise caused by environmental changes. For example, a ground change according to a change in current consumption can result in horizontal band noise, which causes horizontal stripes to appear on displayed images.

Thus, there is a need for devices to minimize the horizontal band noise to improve image quality.

SUMMARY

An exemplary embodiment of the inventive concept is directed to an amplifier. The amplifier includes a differential amplifier including a tail, a current mirror connected between output terminals of the differential amplifier and a power line receiving a supply voltage, and a first switching circuit for connecting and disconnecting one of the output terminals of the differential amplifier to and from the tail in response to a first switching signal.

The amplifier may further include a second switching circuit for connecting and disconnecting the other one of the output terminals of the differential amplifier and the tail in response to a second switching signal.

The first switching signal may be one of two input signals of the differential amplifier and the second switching signal is the other one of the two input signals of the differential amplifier.

The first switching signal may be generated by combination of input signals of the differential amplifier. The amplifier may be an operational transconductance amplifier (OTA). The amplifier may be part of a correlated double sampling circuit.

An example embodiment of the inventive concept is directed to an image sensor, including a pixel, a ramp voltage generator for outputting a ramp signal, and the amplifier. The amplifier amplifies difference between a pixel signal output from the pixel and the ramp signal.

The amplifier may further include a second switching signal for switching between the other of one of the output terminals of the differential amplifier and the tail in response to a second switching signal. The first switching signal may be one of the pixel signal and the ramp signal, and the second switching signal may be the other one of the pixel signal and the ramp signal. The first switching signal may be generated by a combination of the pixel signal and the ramp signal. In alternate embodiment of the inventive concept, an image processing system includes the image sensor and a processor for controlling an operation of the image sensor.

An exemplary embodiment of the inventive concept is directed to an amplifier, which includes a differential amplifier including a tail, a current mirror connected between output terminals of the differential amplifier and a power line receiving a supply voltage, and a switching circuit for switching between the power line receiving the supply voltage and the tail in response to a switching signal. The switching signal may be an output voltage of the amplifier.

The amplifier may further include a plurality of transistors connected in series between the power and the switching circuit. Each of the plurality of transistors may be a diode-connected transistor.

An exemplary embodiment of the inventive concept is directed to an image sensor, including a pixel, a ramp voltage generator for outputting a ramp signal, and the amplifier. The amplifier amplifies a difference between a pixel signal output from the pixel and the ramp signal. The switching signal may be an output voltage of the amplifier. In an alternate embodiment of the inventive concept, an image processing system includes the image sensor and a processor for controlling an operation of the image sensor.

An exemplary embodiment of the inventive concept provides an image processing device. The device includes a pixel, a ramp voltage generator for outputting a ramp signal, a differential amplifier including a tail and amplifying a difference between a pixel signal output by the pixel and the ramp signal, a current mirror connected between output terminals of the differential amplifier and a power line receiving a supply voltage, and a switching circuit for connecting and disconnecting a line receiving a voltage to and from the tail in response to a switching signal. The switching signal may be an output voltage of the current mirror.

An image processing device according to an exemplary embodiment of the inventive concept includes an image sensor having an amplifier. The amplifier includes a differential amplifier having two output terminals, a current mirror, and a first switching transistor. The differential amplifier includes a differential pair of transistors and a current source, where a same terminal of each transistor is fed by the current source. The current mirror includes a first current branch and a second current branch. Each current branch is connected between a power line receiving a supply voltage and a distinct one of the output terminals. The first switching transistor for connecting and disconnecting one of the two output terminals to and from the current source in response to a first switching signal applied to a gate of the first switching transistor.

BRIEF DESCRIPTION OF THE DRAWINGS

The inventive concept will become more apparent from the following description of exemplary embodiments thereof, when taken in conjunction with the accompanying drawings of which.

DETAILED DESCRIPTION

Figure 1:
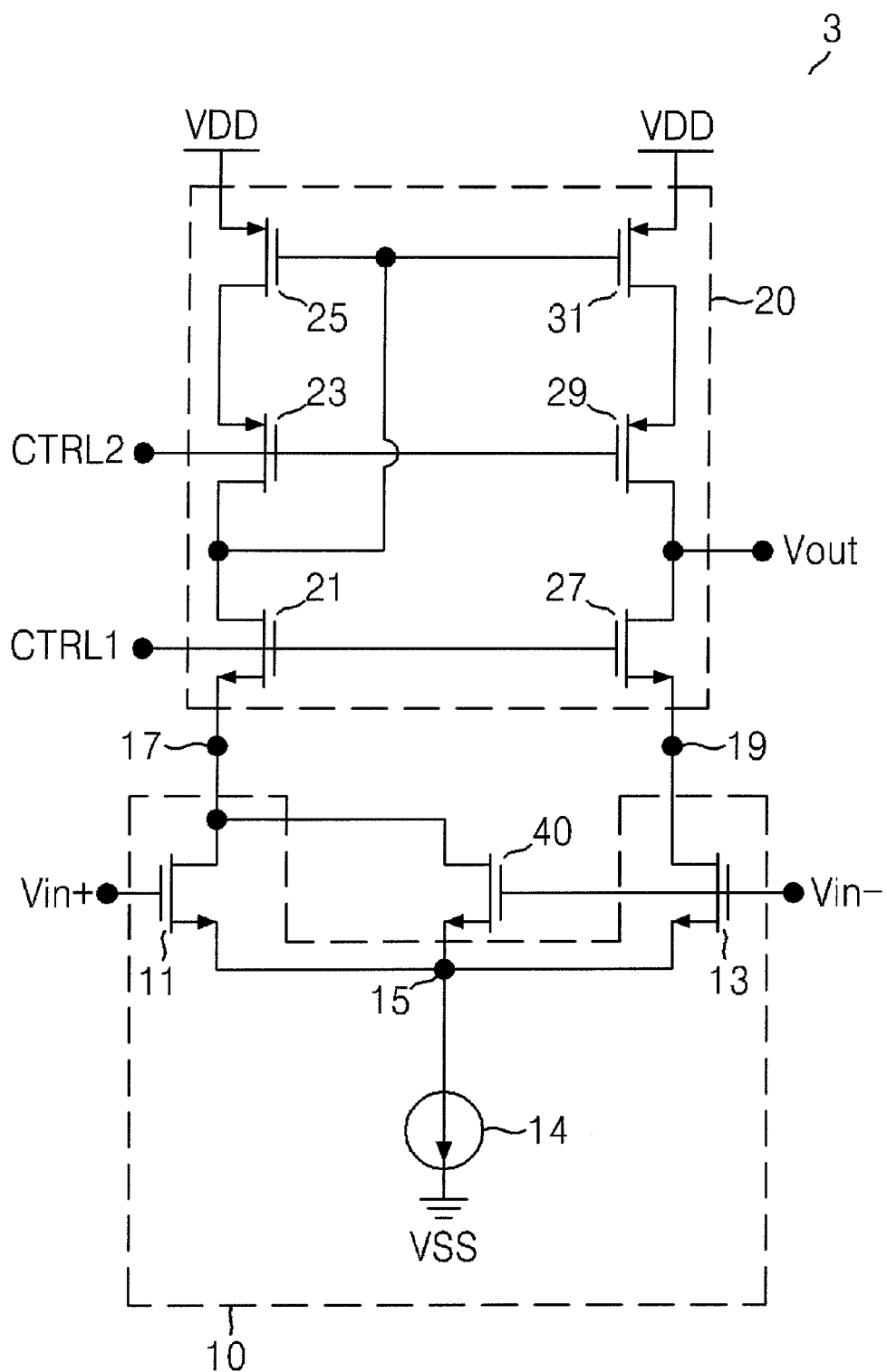
FIG. 1 shows a circuit diagram of an amplifier according to an exemplary embodiment of the inventive concept.

Reference will now be made in detail to exemplary embodiments of the inventive concept, examples of which are illustrated in the accompanying drawings, wherein like reference numerals refer to like elements throughout.

Figure 2:
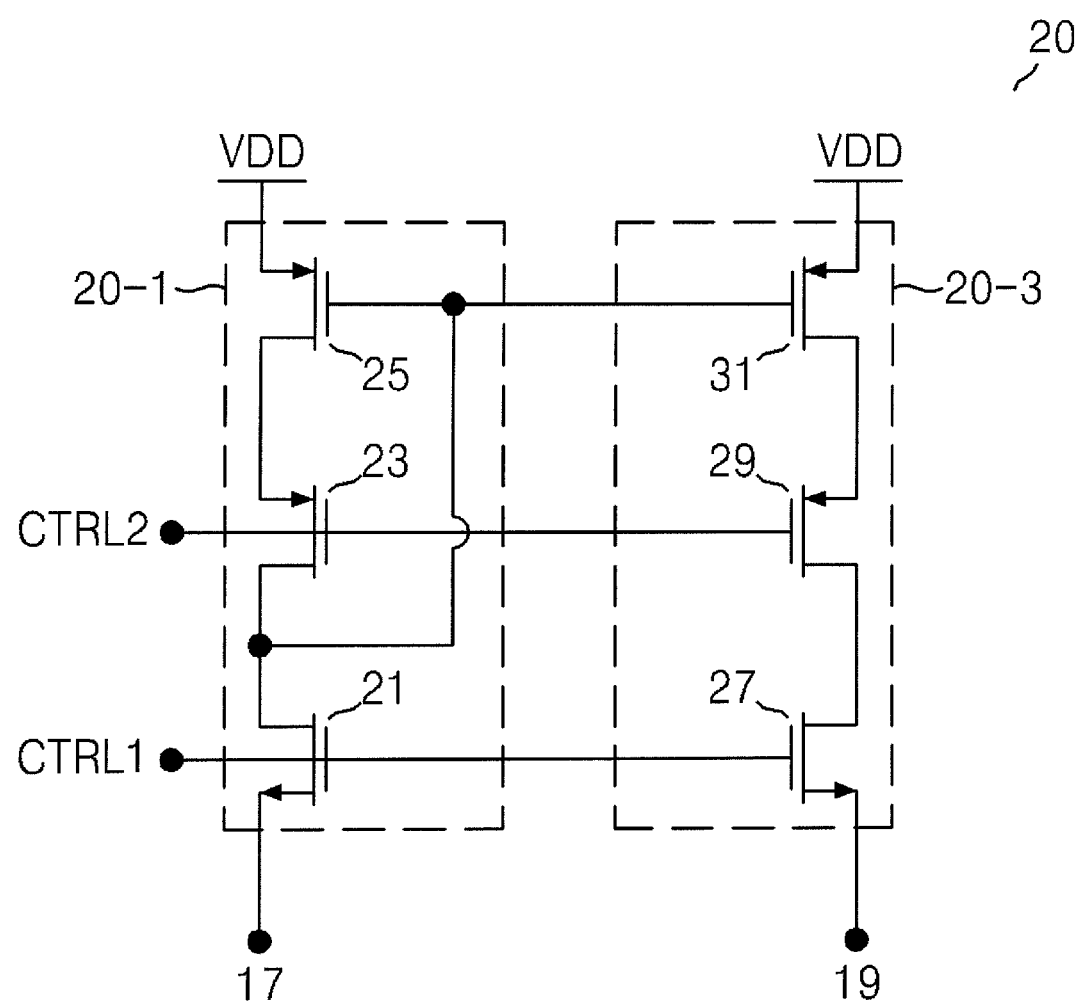
FIG. 2 shows a circuit diagram of a current mirror illustrated in FIG. 1.

FIG. 1 shows a circuit diagram of an amplifier according to an exemplary embodiment of the inventive concept, and FIG. 2 shows a circuit diagram of a current mirror illustrated in FIG. 1. Referring to FIGS. 1 and 2, an amplifier 3 includes a differential amplifier 10, a current mirror 20 and a first switching circuit 40.

The differential amplifier 10 includes a first transistor 11, a second transistor 13 and a current source 14. A first input signal Vin+ is input to an input terminal (e.g., a gate) of the first transistor 11 and a second input signal Vin− is input to an input terminal (e.g., a gate) of the second transistor 13.

As an example, each of the first transistor 11 and the second transistor 13 may be embodied by an N-channel metal oxide semiconductor field-effect transistor (NMOSFET). Each of the transistors 11 and 13 is commonly connected to a tail 15. For, example, the transistors 11 and 13 may be referred to as a differential pair with a tail where a same (emitter, cathode, or source) is fed from a current source 14.

The differential amplifier 10 outputs output signals through output terminals 17 and 19 by amplifying a difference between the input signals Vin+ and Vin−.

A plurality of transistors 23, 25, 29 and 31 form the current mirror 20. The current mirror 20 is connected between a power line receiving a supply voltage VDD and output terminals 17 and 19 of the differential amplifier 10. The current mirror 20 includes a first current branch 20-1 and a second current branch 20-3.

The first current branch 20-1 where a reference current may flow includes a plurality of transistors 21, 23 and 25 connected in series between the power line receiving a supply voltage VDD and the first output terminal 17 of the differential amplifier 10. The second current branch 20-3 where a mirror current may flow includes a plurality of transistors 27, 29 and 31 connected in series between the power line receiving a supply voltage VDD and the second output terminal 19 of the differential amplifier 10. The mirror current may be a copy of the reference current.

Each of transistors 21 and 27 performs a switching operation in response to a first control signal CTRL1. Accordingly, a current flowing in each of transistors 21 and 27 may be controlled according to a level of the first control signal CTRL1.

Each of transistors 23 and 29 perform a switching operation in response to a second control signal CTRL2. Accordingly, a current flowing in each of transistors 23 and 29 may be controlled according to a level of the second control signal CTRL2.

According to an exemplary embodiment of the inventive concept, each of transistors 21, 23, 27 and 29 may operate in a saturation region in response to the level of each of the first control signal CTRL1 and the second control signal CTRL2. For example, each of transistors 23, 25, 29 and 31 may be embodied by a P-channel MOSFET (PMOSFET) and each of transistors 21 and 27 may be embodied by a NMOSFET.

The first switching circuit 40 may switch between the first output terminal 17 and the tail 15 in response to one of the input signals Vin+ and Vin− (e.g., Vin−). As an example, the first switching circuit 40 may be embodied by an NMOSFET. For example, a voltage applied to the gate of the NMOSFET may control whether the first output terminal 17 is connected to the tail 15.

An operation of the amplifier 3 will be explained below with reference to FIG. 1. When each of transistors 21, 23, 25, 27, 29 and 31 operates in a saturation region and a level of the first input signal Vin+ is higher than a level of the second input signal Vin−, the first transistor 11 is turned on and the second transistor 13 is turned off.

Accordingly, a current path is formed by the first current branch 20-1 between the supply voltage VDD and a ground voltage VSS. Here, a current flowing in the first current branch 20-1 is the same as a current flowing in the current source 14. The mirror current (e.g., a copy of the reference current flowing in the first current branch 20-1) flows in the second current branch 20-3.

However, when the amplifier 3 does not include a first switching circuit 40, each of transistors 21, 23, 25, 27, 29 and 31 operates in a saturation region and a level of the second input signal Vin− is higher than a level of the first input signal Vin+. Thus, the second transistor 13 is turned on and the first transistor 11 is turned off. Accordingly, since a current does not flow in the first current branch 20-1, there is no current flowing in the second current branch 20-3.

For example, when a level of the second input signal Vin− is considerably higher than a level of the first input signal Vin+, an output voltage Vout of the amplifier 10 formed in a second current branch 20-3 becomes 0.

When the amplifier 3 includes the first switching circuit 40, the first switching circuit 40 is turned on in response to the second input signal Vin− even though a level of the second input signal Vin− is considerably higher than a level of the first input signal Vin+. Accordingly, the reference current flows in the first current branch 20-1 and the mirror current flows in the second current branch 20-3.

For example, the amplifier 3 including the first switching circuit 40 may ensure that the current flowing in the current source 14 in the first current branch 20-1 is the same as the current flowing in the second current branch 20-3, regardless of the level of the first input signal Vin+ and the second input signal Vin−.

The amplifier 3 illustrated in FIG. 1 may be embodied as a telescopic operational transconductance amplifier (OTA). However, embodiments of the inventive concept are not limited thereto. For example, the amplifier 3 may be also embodied by a two stage OTA or a folded cascode OTA. Further, while the current mirror 20 is illustrated FIG. 1 as a wide swing current mirror, embodiments of the inventive concept are not limited thereto and may be embodied by various kinds of current mirrors.

For convenience of explanation, the amplifier 3 including an NMOS-type differential amplifier 10 is illustrated in FIG. 1. However, embodiments of the inventive concept are not limited thereto. For example, the amplifier 3 may include a PMOS-type differential amplifier including a switching circuit corresponding to the first switching circuit 40.

Figure 3:
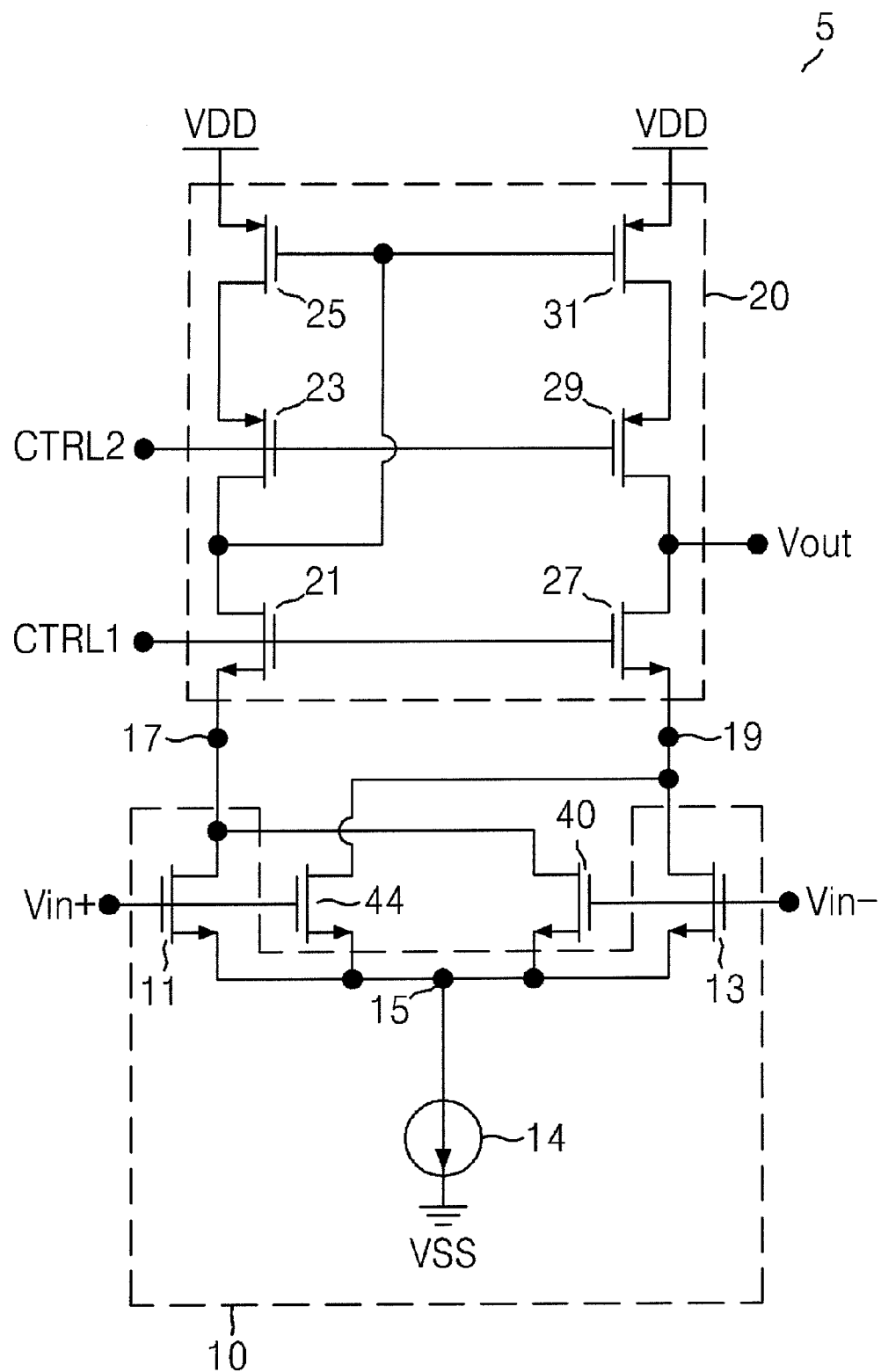
FIG. 3 shows a circuit diagram of an amplifier according to an exemplary embodiment of the inventive concept.

FIG. 3 shows a circuit diagram of an amplifier according to an exemplary embodiment of the inventive concept. The amplifier 5 of FIG. 3 is similar to the amplifier 3 of FIG. 1, except that the amplifier 5 further includes a second switching circuit 44.

The second switching circuit 44 is connected between a second output terminal 19 of the differential amplifier 10 and a tail 15 in response to a first input signal Vin+. The second switching circuit 44 may be embodied by an NMOSFET.

When a level of the first input signal Vin+ is considerably higher than a level of a second input signal Vin−, each of transistors 11 and 44 is turned on and each of transistors 13 and 40 is turned off. Accordingly, a current flows in each of branches 20-1 and 20-3. Moreover, when a level of the second input signal Vin− is considerably higher than a level of the first input signal Vin+, each of transistors 13 and 40 is turned on and each of transistors 11 and 44 is turned off. Accordingly, current flows in each of branches 20-1 and 20-3 and a current flowing in each of branches 20-1 and 20-3 becomes the same as a current flowing in a current source 14.

Figure 4:
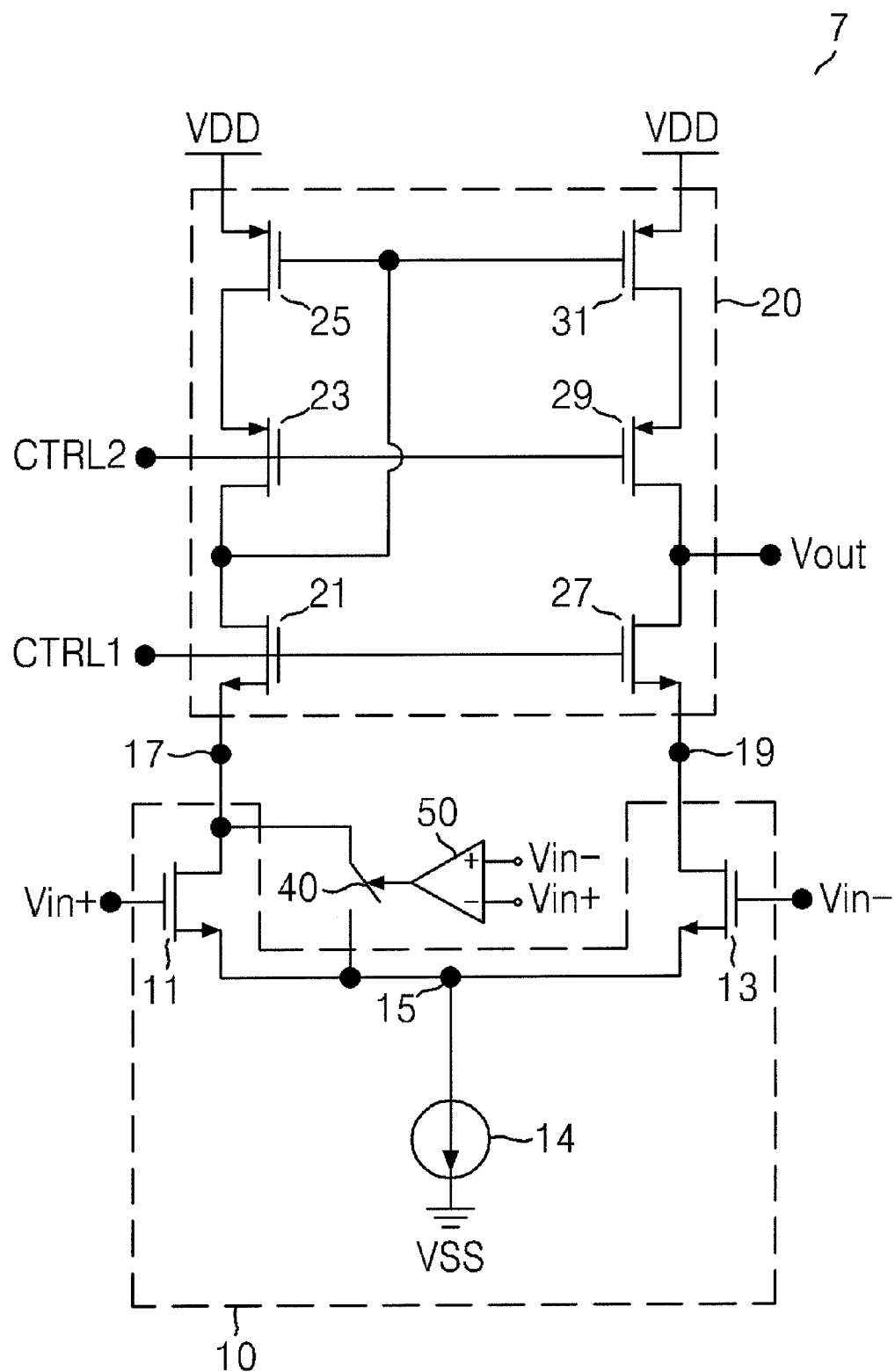
FIG. 4 shows a circuit diagram of an amplifier according to an exemplary embodiment of the inventive concept.

FIG. 4 shows a circuit of an amplifier according to an exemplary embodiment of the inventive concept. The amplifier 7 of FIG. 4 is similar to the amplifier 1 of FIG. 1, except that the amplifier 7 further includes a comparator 50. A first switching circuit 40 may connect a first output terminal 17 of a differential amplifier 10 with a tail 15 in response to an output signal of the comparator 50. The comparator 50 may compare a first input signal Vin+ with a second input signal Vin− and generate a switching signal controlling a switching operation of the first switching circuit 40 according to a result of the comparison. In alternate embodiments of the inventive concept, the comparator 50 may be embodied by a comparator having a hysteresis characteristic. As an example, the comparator having the hysteresis characteristic may be a Schmidt trigger or an inverter Schmidt trigger.

Figure 5:
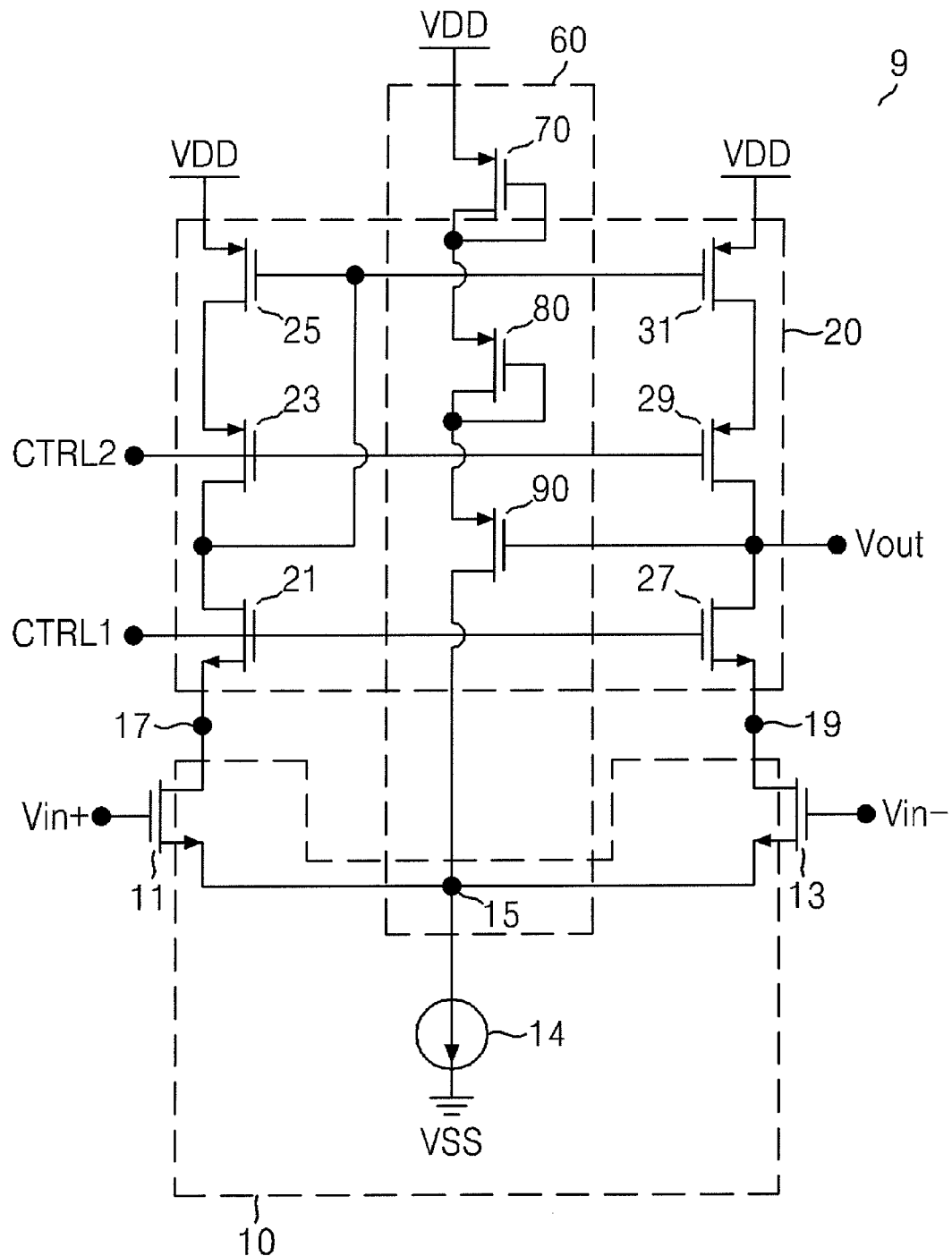
FIG. 5 shows a circuit diagram of an amplifier according to an exemplary embodiment of the inventive concept.

FIG. 5 shows a circuit of an amplifier according to an exemplary embodiment of the present invention. Referring to FIGS. 2 and 5, an amplifier 9 includes a differential amplifier 10, a current mirror 20 and a switching circuit 60.

The switching circuit 60 may be connected between a power line receiving a supply voltage VDD and a tail 15 in response to an output signal Vout of the amplifier 9. Here, the output signal Vout of the amplifier 9 is used as a switching signal of the switching circuit 60.

The switching circuit 60 may include a transistor 90 and plurality of transistors 70 and 80 connected in series between the power line receiving the supply voltage VDD and the transistor 90. Each of the plurality of transistors 70 and 80 may be embodied by a diode-connected transistor.

When a level of a second input signal Vin− is higher than a level of a first input signal Vin+, so that an output signal Vout of the amplifier 9 is a low level (e.g., a ground voltage), the switching circuit 90 (e.g., embodied by a PMOSFET) is turned on and a current path is formed between the power line receiving the supply voltage VDD and the tail 15.

Each of amplifiers 3, 5, 7 and 9 described above with reference to FIGS. 1 to 5 may ensure that a current flows in a second current branch 20-3 even when a level of a second input voltage Vin− is considerably higher than a level of a first input voltage Vin+. Accordingly, instances of horizontal band noise occurring in an image sensor that includes one of amplifiers 3, 5, 7, and 9 may be reduced or eliminated.

Figure 6:
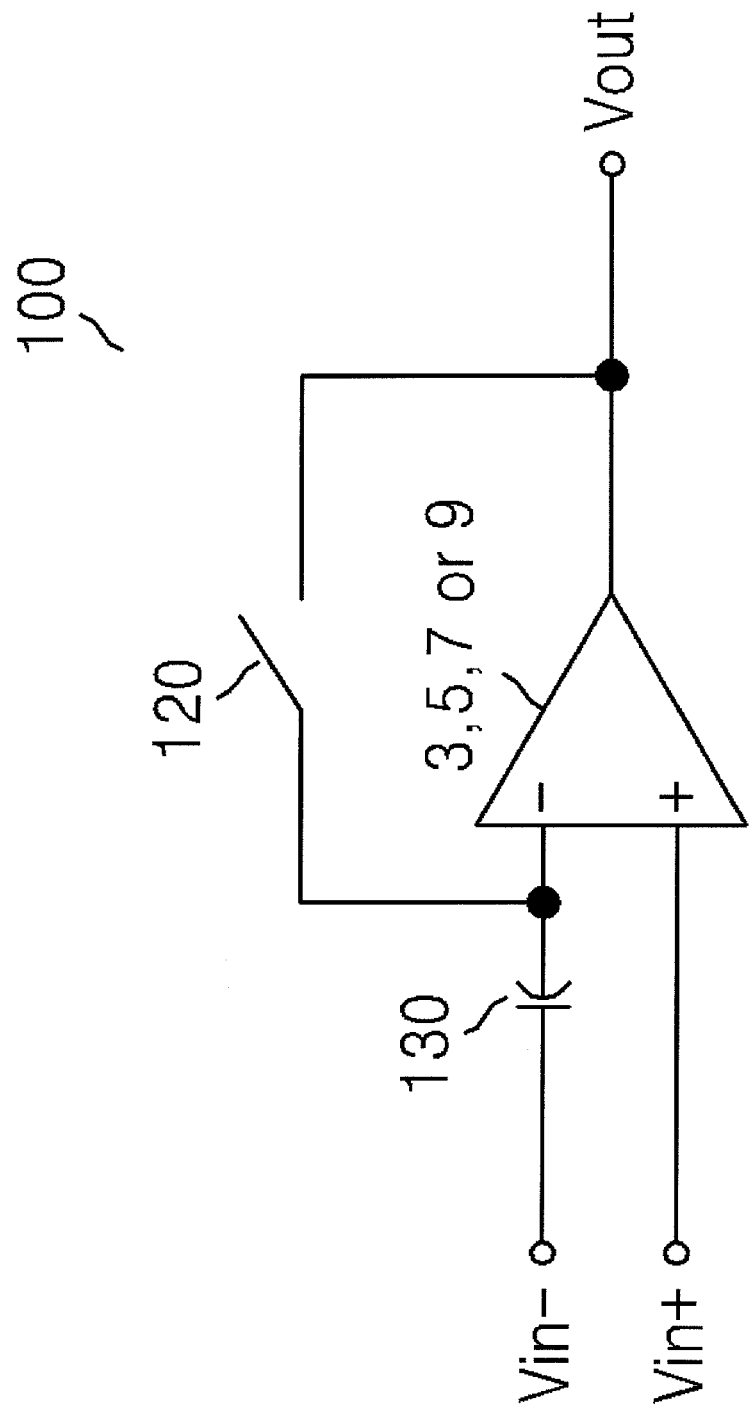
FIG. 6 shows a correlated double sampling circuit including one of the amplifiers according to an exemplary embodiment of the inventive concept.
Figure 7:
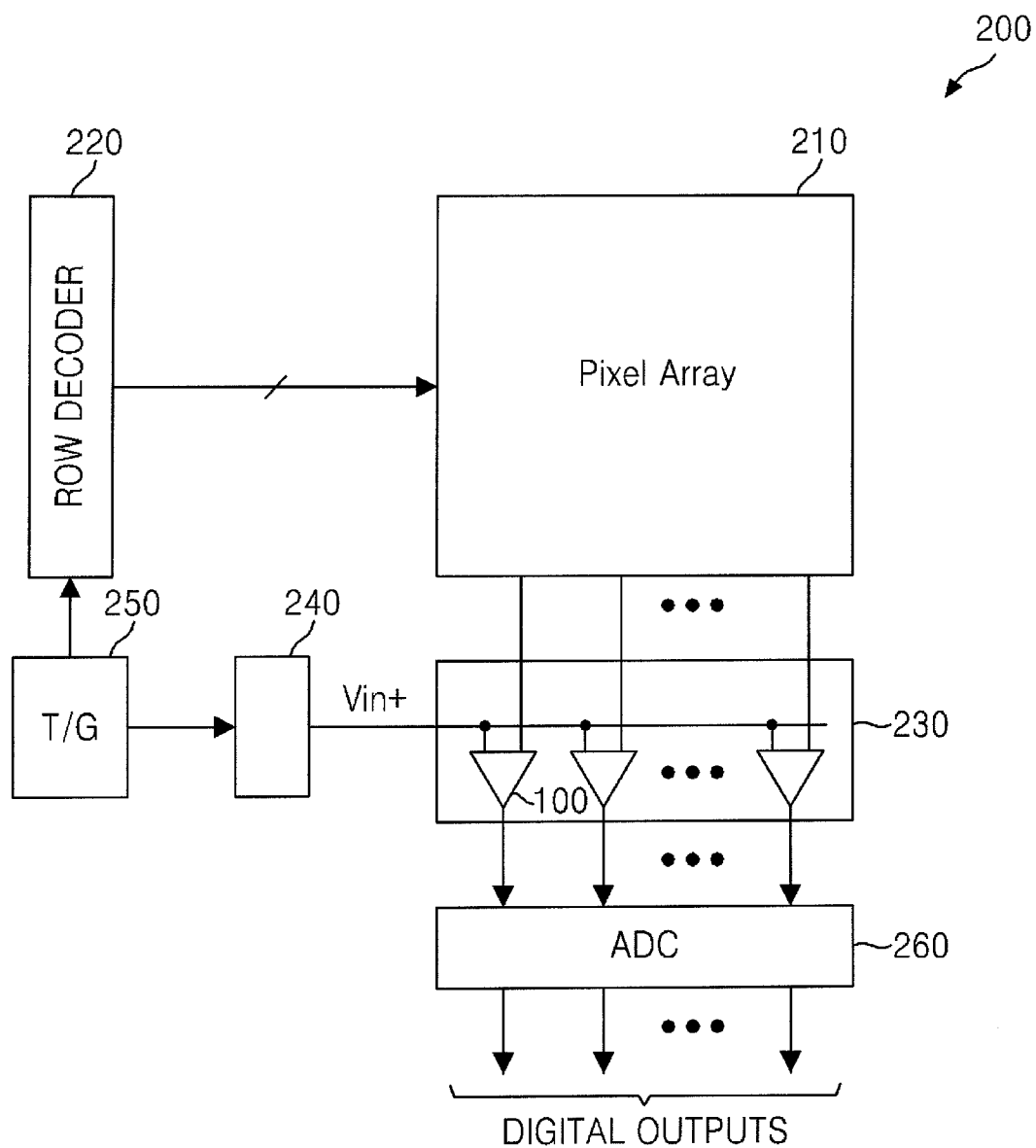
FIG. 7 shows a block diagram of an image sensor including the correlated double sampling circuit illustrated in FIG. 6 according to an exemplary embodiment of the inventive concept.

FIG. 6 shows a correlated double sampling circuit including one of the above described amplifiers 3, 5, 7 and 9 according to an exemplary embodiment of the inventive concept. FIG. 7 shows a block diagram of an image sensor including the correlated double sampling circuit illustrated in FIG. 6 according to an exemplary embodiment of the inventive concept.

Referring to FIGS. 6 and 7, the correlated double sampling circuit 100 including an amplifier embodied by one of amplifiers 3, 5, 7 and 9 according to an exemplary embodiment of the inventive concept includes a switch 120 and a capacitor 130.

A first input signal Vin+ supplied to a first input terminal(+) is an output signal of a ramp signal generator 240, and a second input signal Vin− supplied to a second input terminal (−) is a pixel signal (e.g., a reset signal and an image signal, output from a pixel of a pixel array).

The switch 120 is connected between a second input terminal(−) of the amplifier (e.g., amplifier 3, 5, 7 or 9) and an output terminal. The capacitor 130 may perform a correlated double sampling operation on the pixel signal (e.g., the reset signal and the image signal).

An image sensor 200 includes a pixel array 210, a row decoder 220, a correlated double sampling (CDS) block 230, the ramp signal generator 240, a timing controller 250 and an analog to digital block 260.

The pixel array 210 includes a plurality of pixels. The row decoder 220 may select some of the plurality of pixels by row in response to control signals output from the timing controller 250.

The CDS block 230 includes a plurality of CDS circuits 100. Each of the plurality of CDS circuits 100 compares a ramp signal Vin+ output from the ramp signal generator 240 with a pixel signal output from each of a plurality of columns of the pixel array 210 and outputs a result of the comparison.

The timing controller 250 generates at least one control signal for controlling an operation of at least one of the pixel array 210, the row decoder 220, the CDS block 230, the ramp signal generator 240 and the analog to digital block 260.

The analog to digital block 260 includes a plurality of analog to digital converters, and each of the plurality of analog to digital converters performs an analog to digital conversion operation on a signal output from each of the plurality of CDS circuits 100.

Figure 8:
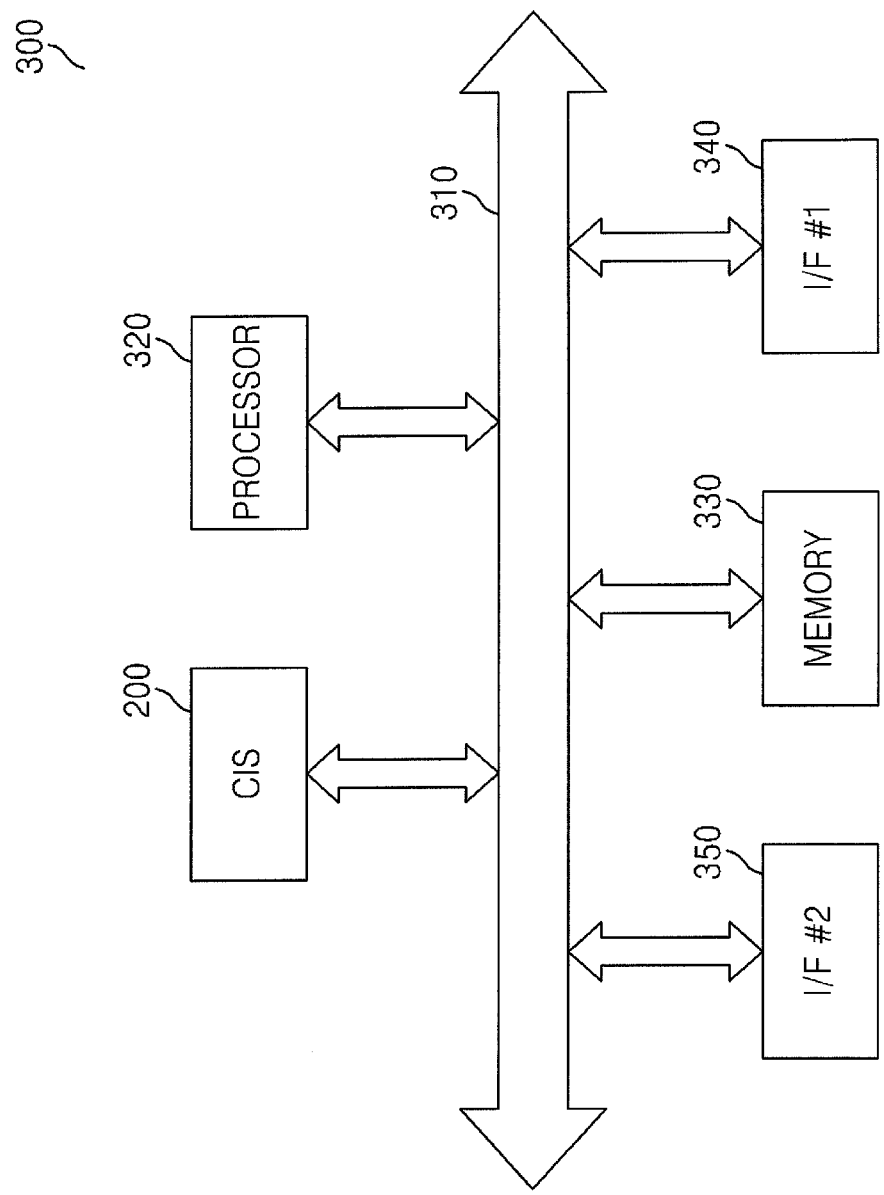
FIG. 8 shows a block diagram of an image processing system including the image sensor illustrated in FIG. 7 according to an exemplary embodiment of the inventive concept.

FIG. 8 shows a block diagram of an image processing system including the image sensor illustrated in FIG. 7 according to an exemplary embodiment of the inventive concept. Referring to FIG. 8, an image processing system 300 may be a digital camera, a mobile communication device including the digital camera (e.g., a mobile phone, a smart phone, a personal digital assistant (PDA), a portable multimedia player (PMP), etc.). Further, the image processing 300 may be an information technology (IT) device.

Referring to FIG. 8, the image processing system 300 includes an image sensor 200 and a processor 320 controlling an operation of the image sensor 200. The image sensor 200 may be embodied by a CMOS image sensor.

When the image sensor 200 requires an image signal processor (not shown) according to an exemplary embodiment, the processor 320 may be used by the image sensor as a central processing unit (CPU) to process an image signal.

When the image sensor 200 does not require an image signal processor according to an exemplary embodiment, the processor 320 may be used as an image signal processor to process an image signal output from the image sensor 200.

The image processing system 300 may further include a memory device 330 for storing an image signal or data processed by the processor 320. The memory device 330 may be embodied by a non-volatile memory element (e.g., an electrically erasable programmable read-only memory (EEPROM), a flash memory, a phase-change RAM (PRAM), a magnetic RAM (MRAM), a resistive RAM (ReRAM), etc.).

The image processing system 300 may further include an input/output interface 340 for outputting an image signal processed by the processor 320 to the outside (e.g., an external device) or transmitting a signal input from the outside to the processor 320. The image processing system 300 may further include a wireless interface 350 for outputting an image signal processed by the processor 320 to the outside or transmitting a signal wirelessly input from the outside to the processor 320. Each component (e.g., 200, 320, 330, 340 or 350) of the image processing system 300 may be connected to each other through a bus 310. As described above, the image processing system 300 may eliminate a horizontal band noise of an image.

As described above, an amplifier according to at least one exemplary embodiment of the inventive concept may retain a current of the amplifier constantly regardless of the level of each of its input signals. Accordingly, when the amplifier is included within an image sensor, quality of an image produced by the image sensor may be improved by minimizing (or reducing) instances of horizontal band noise occurring in the image sensor.

While the inventive concept has been shown and described with reference to exemplary embodiments thereof, it will be understood by those skilled in the art that changes may be made in these embodiments without departing from the spirit and scope of the disclosure.

What is claimed is:

1. An amplifier comprising:
   a differential amplifier including a tail;
   a current mirror connected between output terminals of the differential amplifier and a power line for receiving a supply voltage; and
   a first switching circuit for connecting and disconnecting one of the output terminals of the differential amplifier to and from the tail in response to a first switching signal.

2. The amplifier of claim 1, further comprising:
   a second switching circuit for connecting and disconnecting the other one of the output terminals of the differential amplifier to and from the tail in response to a second switching signal.

3. The amplifier of claim 2, wherein the first switching signal is one of two input signals of the differential amplifier and the second switching signal is the other of the two input signals of the differential amplifier.

4. The amplifier of claim 1, wherein the first switching signal is generated by a combination of the two input signals of the differential amplifier.

5. The amplifier of claim 1, wherein the amplifier is an operational transconductance amplifier OTA.

6. The amplifier of claim 1, wherein the amplifier is part of a correlated double sampling circuit.

7. An image processing device comprising:
   a pixel;
   a ramp voltage generator for outputting a ramp signal;
   a differential amplifier including a tail and amplifying a difference between a pixel signal output by the pixel and the ramp signal;
   a current mirror connected between output terminals of the differential amplifier and a power line receiving a supply voltage; and
   a switching circuit for connecting and disconnecting a line receiving a voltage to and from the tail in response to a switching signal.

8. The image processing device of claim 7, further comprising a plurality of transistors connected in series between the line and the switching circuit.

9. The image processing device of claim 8, wherein each of the plurality of transistors is a diode-connected transistor.

10. The image processing device of claim 7, wherein the switching signal is an output voltage of the current mirror.

11. An image processing device comprising an image sensor having an amplifier, the amplifier comprising:
    a differential amplifier having two output terminals, wherein the differential amplifier comprises a differential pair of transistors and a current source, where a same terminal of each transistor is fed by the current source;
    a current mirror comprising a first current branch and a second current branch, wherein each current branch is connected between a power line receiving a supply voltage and a distinct one of the output terminals; and
    a first switching transistor for connecting and disconnecting one of the two output terminals to and from the current source in response to a first switching signal applied to a gate of the first switching transistor.

12. The image processing device of claim 11, wherein a gate of one of the transistors of the pair receives the first switching signal.

13. The image processing device of claim 12, further comprising a second switching transistor for connecting and disconnecting the other one of the two output terminals to and from the current source in response to a second switching signal applied to a gate of the second switching transistor, and wherein a gate of the other one of the transistors of the pair receives the second switching signal.

14. The image processing device of claim 11, further comprising a comparator receiving a first input signal and a second input signal, wherein the output of the comparator is the first switching signal and a gate of each one of the transistors of the pair receive a distinct one of the input signals.

15. The image processing device of claim 11, further including a correlated double sampling circuit, wherein the amplifier is part of the correlated double sampling circuit.

16. The image processing device of claim 15, wherein the correlated double sampling circuit comprises:
    a capacitor connected between a first input voltage and a first input terminal of the amplifier; and
    a switch connected at a point after the capacitor between the first input terminal and an output terminal of the amplifier.

17. The image processing device of claim 11, further comprising:
    a pixel array for generating pixel signals; and
    a ramp voltage generator for generating a ramp signal,
    wherein a gate of one of the transistors of the pair receives one of the pixel signals and a gate of the other transistor of the pair receives the ramp signal.

18. The image processing device of claim 15, further comprising an analog to digital converter receiving an output of the correlated double sampling circuit.

19. The image processing device of claim 11, further comprising a processor to control an operation of the image sensor.

20. The image processing device of claim 11, wherein the amplifier is a folded cascode operational tranconductance amplifier.

* * * * *